(12) United States Patent
Niehof et al.

(10) Patent No.: US 10,098,146 B2
(45) Date of Patent: Oct. 9, 2018

(54) DATA PROCESSOR

(71) Applicant: NXP B.V., Eindhoven (NL)

(72) Inventors: Jan Niehof, Eindhoven (NL); Shagun Bajoria, Eindhoven (NL); Muhammed Bolatkale, Eindhoven (NL); Robert Rutten, Nistelrode (NL); Lucien Johannes Breems, Eindhoven (NL); Johannes Hubertus Antonius Brekelmans, Eindhoven (NL)

(73) Assignee: NXP B.V., Eindhoven (NL)

( * ) Notice: Subject to any disclaimer, the term of this patent is extended or adjusted under 35 U.S.C. 154(b) by 89 days.

(21) Appl. No.: 15/356,451

(22) Filed: Nov. 18, 2016

(65) Prior Publication Data

US 2017/0150521 A1 May 25, 2017

(30) Foreign Application Priority Data

Nov. 24, 2015 (EP) ..................................... 15196076

(51) Int. Cl.
*H04W 74/00* (2009.01)
*H03M 1/06* (2006.01)
(Continued)

(52) U.S. Cl.
CPC ....... *H04W 74/002* (2013.01); *H03M 1/0678* (2013.01); *H03M 1/08* (2013.01);
(Continued)

(58) Field of Classification Search
CPC ... H04W 74/00; H03M 1/183; H03M 1/0678; H03M 1/08; H03M 1/123; H04L 5/0051
(Continued)

(56) References Cited

U.S. PATENT DOCUMENTS

| 5,671,172 A | 9/1997 | Britton |
| 2009/0070104 A1* | 3/2009 | Jones ........................ G01S 5/30 704/211 |

(Continued)

FOREIGN PATENT DOCUMENTS

KR 20020049748 A 6/2002

OTHER PUBLICATIONS

A 12-Bit High-Speed Column-Parallel Two-Step Single-Slope Analog-to-Digital Converter (ADC) for CMOS Image Sensors Tao Lyu, Suying Yao, Kaiming Nie and Jiangtao Xu *.*
(Continued)

*Primary Examiner* — Inder P Mehra
(74) *Attorney, Agent, or Firm* — Rajeev Madnawat

(57) ABSTRACT

A processor is disclosed. The processor includes a first-receiver-node for receiving a first-receiver-signal, a second-receiver-node for receiving a second-receiver-signal, a first-output-node for coupling to a digital-baseband-processor, a second-output-node for coupling to the digital-baseband-processor and a first-active-data-pipe extending between the first-receiver-node and the first-output-node. The first-active-data-pipe includes a first-analog-to-digital-converter comprising a first-ADC-input coupled to the first-receiver-node and a first-ADC-output coupled to the first-output-node. The first-analog-to-digital-converter is configured to provide a first-digital-signal to the first-output-node. The processor comprises a first-reference-node and a configurable-data-pipe extending between the second-receiver-node and the second-output-node.

15 Claims, 3 Drawing Sheets

(51) Int. Cl.
*H03M 1/08* (2006.01)
*H03M 1/12* (2006.01)
*H04L 5/00* (2006.01)
*H03M 1/18* (2006.01)

(52) U.S. Cl.
CPC .......... *H03M 1/183* (2013.01); *H04L 5/0051* (2013.01); *H03M 1/123* (2013.01)

(58) Field of Classification Search
USPC .......................... 455/515, 130; 370/491, 500
See application file for complete search history.

(56) References Cited

U.S. PATENT DOCUMENTS

| | | | | |
|---|---|---|---|---|
| 2009/0131010 | A1* | 5/2009 | Oshima | H03M 1/122 455/334 |
| 2010/0197240 | A1* | 8/2010 | Van Den Brink | H04L 1/244 455/67.11 |
| 2013/0195151 | A1 | 8/2013 | Miller et al. | |
| 2017/0046007 | A1* | 2/2017 | Kitagawa | G06F 3/041 |

OTHER PUBLICATIONS

Extended European Search Report for Patent Appln. No. 15196076.2 (dated Jun. 2, 2016).

Lyu, T. et al. "A 12-Bit High-Speed Column-Parallel Two-Step Single-Slope Analog-to-Digital Converter (ADC) for CMOS Image Sensors", Sensors, 23 pgs. (2014).

Sleiman, B, et al. "Built-in-Self-Test and Digital Self-Calibration for RF SoCs", 2 pgs.

Zhang, C. "Built-In Self Test of RF Subsystems", The University of Texas at Austin, 136 pgs. (2008).

Sarwana, S, et al. "Multi-band Digital-RF Receiver", IEEE Transactions on Applied Superconductivity, vol. 21, No. 3, pp. 677-680 (Jun. 2011).

\* cited by examiner

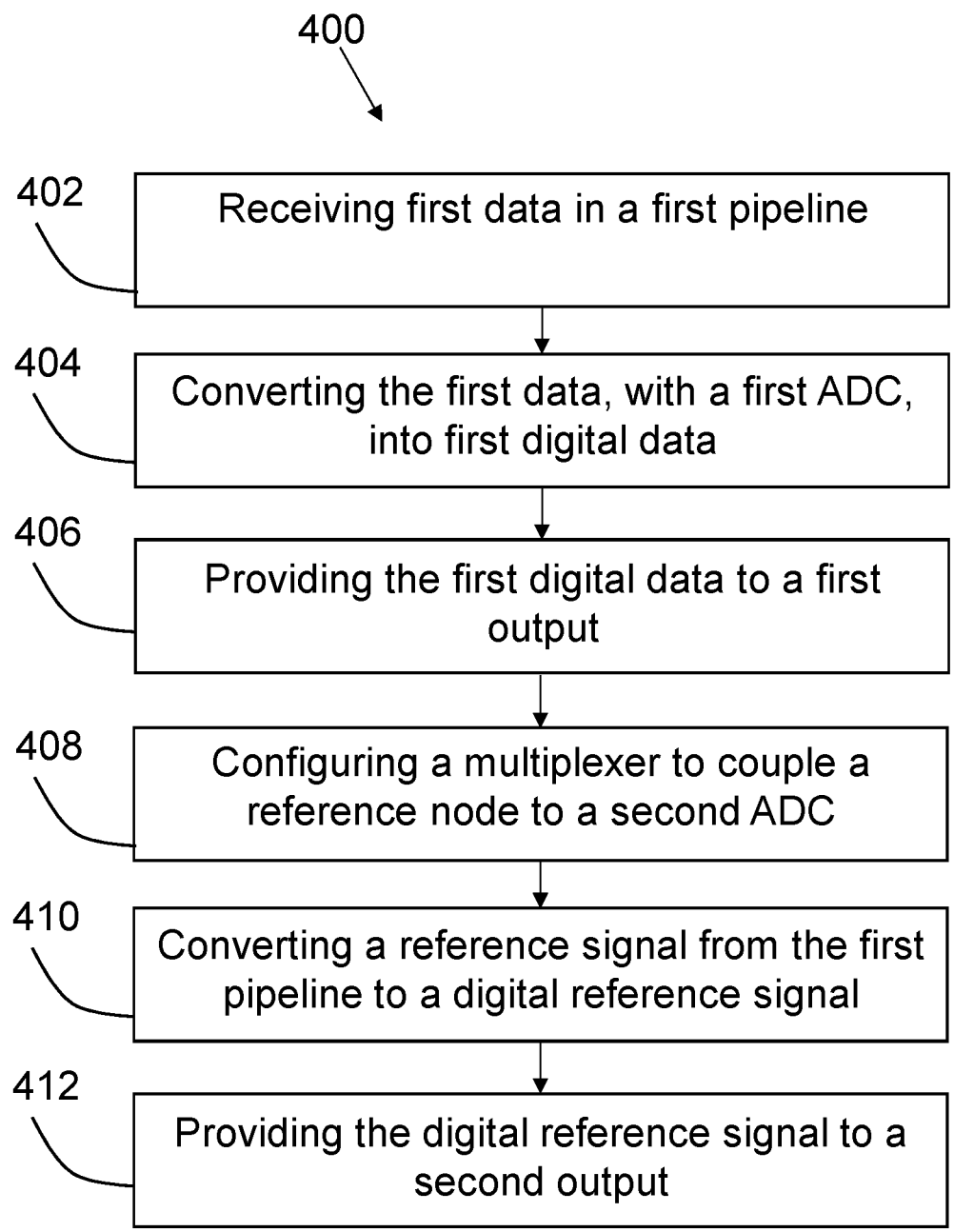

DATA PROCESSOR

CROSS-REFERENCE TO RELATED APPLICATIONS

This application claims the priority under 35 U.S.C. § 119 of European Patent application no. 15196076.2, filed on Nov. 24, 2015, the contents of which are incorporated by reference herein.

The present disclosure relates to multi-pipeline data processors and in particular, although not necessarily, to a multi-pipeline data processor configured to receive a plurality of analogue input signals and to provide at least one digital output signal.

According to a first aspect of the present disclosure there is provided a processor comprising: a first-receiver-node for receiving a first-receiver-signal; a second-receiver-node for receiving a second-receiver-signal; a first-output-node for coupling to a digital-baseband-processor; a second-output-node for coupling to the digital-baseband-processor; a first-active-data-pipe extending between the first-receiver-node and the first-output-node, the first-active-data-pipe comprising: a first-analogue-to-digital-converter comprising a first-ADC-input coupled to the first-receiver-node; and a first-ADC-output coupled to the first-output-node; wherein the first-analogue-to-digital-converter is configured to provide a first-digital-signal to the first-output-node; a first-reference-node associated with the first-active-data-pipe; and a configurable-data-pipe extending between the second-receiver-node and the second-output-node, the configurable-data-pipe comprising: a configurable-pipeline-multiplexer comprising: a first-MUX-input-node coupled to the second-receiver-node; a second-MUX-input-node coupled to the first-reference-node; and a MUX-output-node; and a second-analogue-to-digital-converter comprising: a second-ADC-input coupled to the MUX-output-node; and a second-ADC-output coupled to the second-output-node, wherein, when the configurable-pipeline-multiplexer is configured to couple the second-MUX-input-node to the MUX-output-node, the second-analogue-to-digital-converter is configured to provide a first-digital-reference-signal to the second-output-node.

According to a further aspect of the present disclosure there is provided a processor comprising: a first-active-data-pipe configured to receive a first-receiver-signal, the first-active-data-pipe comprising a first-analogue-to-digital-converter configured to provide a first-digital-signal based on the first-receiver-signal; a configurable-data-pipe comprising a configurable-pipeline-multiplexer and a second-analogue-to-digital-converter; wherein the configurable-pipeline-multiplexer is configurable to couple a first-reference-signal, associated with the first-active-data-pipe, to the second-analogue-to-digital-converter, wherein the second-analogue-to-digital-converter is configured to provide a first-digital-reference-signal.

In one or more embodiments the first-reference node is coupled to one of a ground terminal, a reference terminal, a common-mode terminal or a bias voltage terminal. The first-reference node may be associated with an input terminal or an output terminal of a component in the first-active-data-pipe.

In one or more embodiments the processor comprises a plurality of reference nodes within the first-active-data-pipe, wherein the configurable-pipeline-multiplexer is configured to selectively couple each of the plurality of reference nodes to the MUX-output node.

In one or more embodiments the processor further comprises a digital baseband processor configured to determine a noise signal based on the first-digital-reference-signal and to subtract the noise signal from the first-digital-signal to provide a noise-cancelled-first-digital-signal to a baseband processor output terminal.

In one or more embodiments the noise signal is the first-digital-reference-signal.

In one or more embodiments the processor further comprises a digital baseband processor configured to: receive the first-digital-reference-signal; generate control signalling based on the first-digital-reference-signal; and provide the control signalling to the first-active-data-pipe to configure the first-active-data-pipe.

In one or more embodiments the digital baseband processor is configured to: compare the first-digital-reference-signal with a predetermined threshold; and generate the control signalling based on the result of the comparison.

In one or more embodiments the digital baseband processor is further configured to receive the first digital signal and to generate the control signalling based on the first digital signal.

In one or more embodiments the processor further comprises a digital baseband processor configured to receive signalling representative of a voltage at respective reference nodes and to provide control signalling to the first-active-data-pipe to configure the first-active-data-pipe based on the received signalling.

In one or more embodiments the first-active-data-pipe further comprises a first-tuner and the digital baseband processor is configured to provide the control signalling to the first-tuner in order to adapt the bandwidth of the first-tuner.

In one or more embodiments the first-active-data-pipe further comprises a first-pipeline-amplifier and the digital baseband processor is configured to provide the control signalling to the first-pipeline-amplifier in order to adapt a power supplied to the first-pipeline-amplifier.

In one or more embodiments the first-active-data-pipe further comprises a first-pipeline-amplifier and the digital baseband processor is configured to provide the control signalling to the first-pipeline-amplifier in order to adapt a frequency response to the first-pipeline-amplifier.

In one or more embodiments the processor further comprises: a second-active-data-pipe; and a second-reference-node associated with the second-active-data-pipe, wherein the configurable-pipeline-multiplexer comprises a third-MUX-input-node coupled to the second-reference-node.

In one or more embodiments the digital baseband processor is configured to: execute a series of commands according to a predetermined sequence; detect a spurious-frequency-signal corresponding to a frequency of the predetermined sequence, based on the first-digital-reference-signal; and modify the predetermined sequence.

In one or more embodiments there may be provided an integrated circuit or an electronic device comprising the processor of the present disclosure.

According to a further aspect of the present disclosure there is provided a method of data processing comprising: receiving a first-receiver-signal in a first-active-data-pipe; converting, with a first-analogue-to-digital-converter, the first-receiver-signal into a first-digital-signal; providing the first-digital-signal to a first-output-node; configuring a configurable-pipeline-multiplexer, in a configurable-data-pipe, to couple a first-reference-node, associated with the first-active-data-pipe, to a second-analogue-to-digital-converter in the configurable-data-pipe; converting, with the secondanalogue-to-digital-converter, a signal from the first-reference-node into a first-digital-reference-signal; and providing the first-digital-reference-signal to a second-output-node.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

FIG. 4 shows an example embodiment of a method of operating a multi-pipeline processor depicted as a flowchart.

Figure 1:
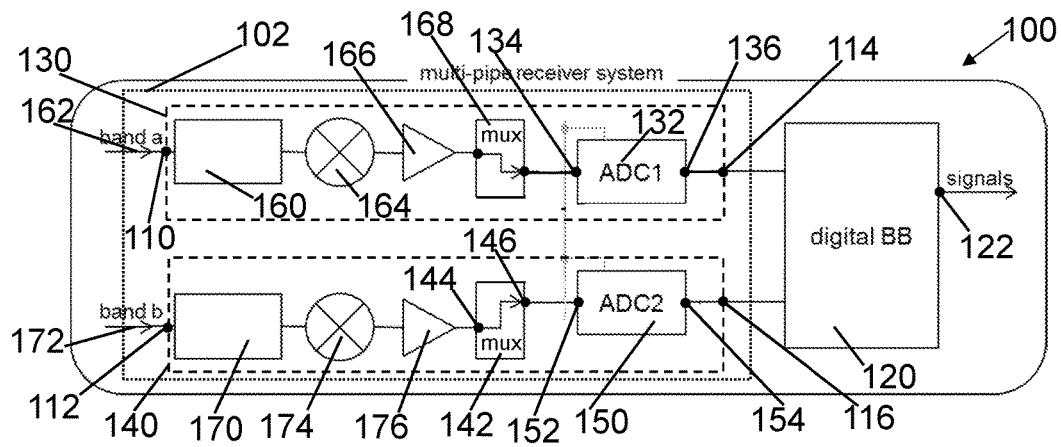
FIG. 1 shows an example of a multi-pipeline processor.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

Electronic receiver systems may be configured to receive multiple different input signals, each carried within a particular frequency band, and to process the input signals simultaneously. Such systems may be said to comprise multiple data pipes, each pipeline comprising a series of components arranged to process a particular input signal. A receiver with multiple pipelines may also be called a multi-pipe receiver system and may make use of multiple analogue to digital converters (ADCs) to simultaneously decode multiple audio/data input streams. These ADCs may be wideband in order to receive as much of the band containing an input signal as possible. Desirable ADCs may have low-power consumption and have a high dynamic range at the same time. Although multi-pipe receiver systems may be designed to receive multiple signal bands simultaneously, there are many use cases where not all pipes may be in use all of the time, which can result in one or more of the ADCs not being used/active. This disclosure describes how in these cases the otherwise idle functionality of the unused pipes, may be used to improve system performance and/or increase system functionality.

FIG. 1 shows an example of a multiple pipeline receiver 100. The receiver 100 comprises a multi-pipe processor 102.

The processor 102 comprises: a first-receiver-node 110 for receiving a first-receiver-signal; a second-receiver-node 112 for receiving a second-receiver-signal; a first-output-node 114 for coupling to a digital-baseband-processor; and a second-output-node 116 for coupling to a digital-baseband-processor. In this example, the processor 102 is coupled via the first-output-node 114 and the second-output-node 116 to a digital baseband processor 120, which is described in greater detail below.

The processor 102 comprises a first-active-data-pipe 130. The first-active-data-pipe 130 extends between the first-receiver-node 110 and the first-output-node 114, and comprises at least a first-analogue-to-digital converter 132. (Further components of the first-active-data-pipe 130 that are illustrated in this example will be described below.) The first analogue-to-digital-converter 132 comprises a first-ADC-input 134 coupled (indirectly coupled in this example) to the first-receiver-node 110, and a first-ADC-output 136 coupled to the first-output-node 114 (directly coupled in this example). Thereby, the first-analogue-to-digital-converter 132 is configured to provide a first-digital-signal to the first-output-node 114. The first-digital-signal may be representative of the first-receiver-signal, for example, where the first-receiver-signal comprises an analogue signal, the first-digital-signal may provide a digitised representation of the first-receiver-signal.

The processor 102 further comprises a second-data-pipe 140 which extends between the second-receiver-node 112 and the second-output-node 116. The second-data-pipe 140 comprises a second-analogue-to-digital-converter 150. The second-analogue-to-digital-converter 140 comprises a second-ADC-input 152 coupled to the second-receiver-node 112, and a second-ADC-output 154 coupled to the second-output-node 116. Thereby, the second-analogue-to-digital-converter 150 is configured to provide a second-digital-signal to the second-output-node 116. The second-digital-signal may be representative of the second-receiver-signal, for example, where the second-receiver-signal comprises an analogue signal, the second-digital-signal may provide a digitised representation of the second-receiver-signal.

In some examples, the multiple pipeline receiver 100 may be configured to receive a plurality of different electromagnetic signals, such as audio signals and/or video signals. To provide suitable first and second receiver signals for the first-analogue-to-digital-converter 132 and the second-analogue-to-digital-converter 140, the processor 102 comprises a number of upstream components. In this example, the first-active-data-pipe 130 also includes a first-pipeline-tuner that is coupled to the first-receiver-node 110 configured to receive a band-a-signal 162. The first-pipeline-tuner comprises a first-pipeline-low-noise-amplifier 160, a first-pipeline-multiplier 164 and a first-pipeline-amplifier 166 connected in series. The band-a-signal 162 is processed by the first-pipeline-tuner and a first-pipeline-multiplexer 168 before being provided to the first-ADC-input 134. In this example, the first-pipeline-multiplexer 168 is shown with only a single input for the band-a-signal. It will be appreciated that the first-pipeline-multiplexer 168 can comprise a plurality of inputs such that it can selectively couple one of a plurality of tuned signals to the first ADC 132. Such other inputs have not been illustrated in FIG. 1 in order to improve the clarity of the disclosure.

Similarly, the second-active-pipeline 140 includes a second-pipeline-tuner 170 configured to receive a band-b-signal 172. The band-b-signal 172 is processed by the second-pipeline-tuner 170, a second-pipeline-multiplier 174, a second-pipeline-amplifier 176, and a second-pipeline-multiplexer 142, before being provided to the second ADC 150. Again, it will be appreciated that the second-pipeline-multiplexer 142 may have at least one additional input node (not shown).

The processor 102 is coupled via the first-output-node 114 and the second-output-node 116 to the digital baseband processor 120. The digital baseband processor 120 is thereby configured to receive digital representations of both the band-a-signals 162 and the band-b-signals 172. The digital baseband processor 120 may further process the signals it receives to provide one or more signals to an output terminal 122. Signals provided to the output terminal 122 may subsequently be coupled to output devices such as loudspeakers, headphones or video display screens (not shown). The multiple pipeline receiver 100 may thereby simultaneously provide a plurality of different audio-visual signals to a plurality of different output devices. For example, the pipeline receiver 100 may provide the functionality for a user to select between different types of radio signals, such as FM, AM, DAB, etc.

Figure 2:
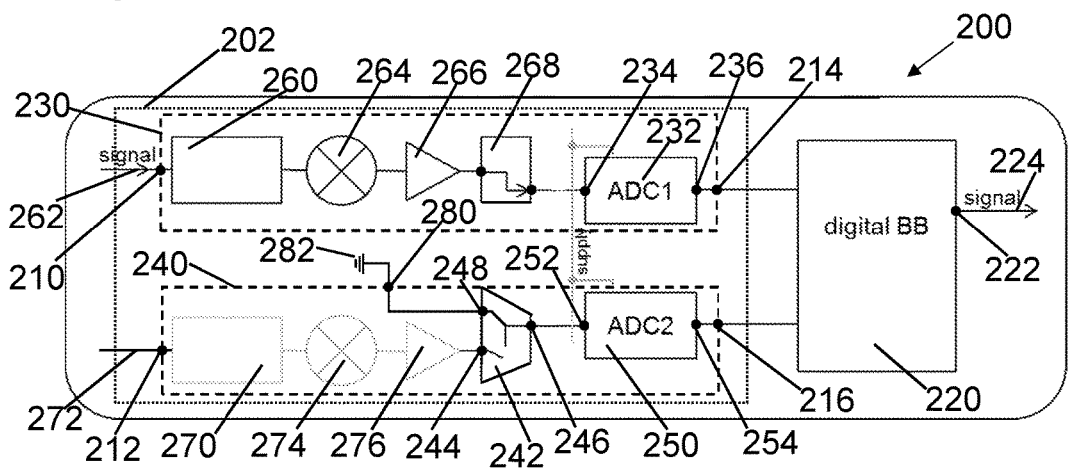
FIG. 2 shows an example embodiment of a multi-pipeline processor with an active pipeline and a configurable pipeline.

FIG. 2 shows an example of a multiple pipeline receiver 200; features shown in FIG. 2 that have corresponding features in FIG. 1 have been given similar reference numerals, and may not necessarily be discussed further here.

The processor 202 shown in FIG. 2 comprises a first-active-data-pipe 230 and a configurable-data-pipe 240. In this example, the first-active-data-pipe 230 includes: a first-pipeline-tuner comprising a first-pipeline-low-noise-amplifier 260, a first-pipeline-mixer 264, a first-pipeline-amplifier 266; a first-pipeline-multiplexer 268; and a first-analogue-to-digital-converter 232. These components are connected in series between the first-receiver-node 210 and the first-output-node 214 of the processor 202.

The configurable-data-pipe 240 comprises a configurable-pipeline-tuner 270, a configurable-pipeline-mixer 274, a configurable-pipeline-amplifier 276, a configurable-pipeline-multiplexer 242, and a second-analogue-to-digital-converter 250. These components are connected in series between the second-receiver-node 212 and the second-output-node 216 of the processor 202.

The configurable-multiplexer 242 comprises a first-configurable-MUX-input-node 244 coupled to the second-receiver-node 212. In a similar way to that illustrated in FIG. 1, the second-receiver-node 212 receives a band-b-signal 272. As discussed above, in this example the first-configurable-MUX-input-node 244 is indirectly coupled to the second-receiver-node 212 via various components. The configurable-multiplexer 242 also includes a second-configurable-MUX-input-node 248 coupled to a first-reference-node 280. The first-reference-node 280 is associated with the first-active-data-pipe 230. The configurable-pipeline-multiplexer 242 is configurable to selectively couple the first-MUX-input-node 244 or the second-MUX-input-node 248 to a MUX-output-node 246. In this way, the downstream second-ADC 250 can be used to process either a tuned signal (in the same way as in FIG. 1) or can process a first-reference-signal from the first-reference-node 280. As will be discussed below, use of such a first-reference-signal can improve the performance of the multiple pipeline receiver 200.

It will be appreciated that, in some examples (not shown), the first-reference-node 280 may be indirectly coupled to the second-configurable-MUX-input-node 248 via one or more optional additional components, such as an amplifier and/or a filter. Thereby, a signal received at the first-reference-node 280 may be pre-processed to provide a signal to the second-configurable-MUX-input-node 248 that will ultimately be suitable for processing by the second-ADC 250.

In this example, the first-reference-node 280 is coupled to a ground terminal 282. It will be appreciated that in other examples the first-reference-node 280 may be connected to a reference terminal which may float relative to electrical ground. In this example the first-reference-node 280 is associated with the first-active-data-pipe 230 because the first-active-data-pipe 230 also comprises a connection to electrical ground (not shown). In this example the first-reference-signal comprises information about the noise present on the ground terminal 282. Since, by virtue of being grounded, the first-active-data-pipe 230 is exposed to the same source of noise as the ground terminal 282, the first-reference-signal is representative of a noise signal present within the first-active-data-pipe 230.

The configurable-multiplexer 242 may couple the first-reference-signal to the second-ADC 250 such that the second-ADC 250 provides a first-reference-signal to the second-output-node 216. The first-reference-signal is also representative of the noise signal present in the first-active-data-pipe 230. Since the second-output-node 216 is coupled to the baseband processor 220, the baseband processor 220 is thereby configured to receive the first-reference-signal. The baseband processor 220 is further configured to subtract the first-reference-signal from a first-digital-signal that is received at the baseband processor 220 from the first-active-data-pipe 230. Thereby, the noise signal present in the first-active-data-pipe 230 can be reduced or removed from the first-digital-signal to provide a noise-cancelled-first-digital-signal 224 to a baseband processor output terminal 222. This reduction or removal of noise from a desired signal provided by the first-active-data-pipe 230 may advantageously provide for superior fidelity in the processing of the desired signal, and thereby, for example, support superior audio and/or video reproduction.

In some examples, the digital baseband processor 220 may be configured to determine a noise signal based on the first-digital-reference-signal and to subtract the noise signal from the first-digital-signal to provide the noise-cancelled-first-digital-signal 224 to the baseband processor output terminal 222. Determination of the noise signal may be based on a comparison between the first-digital-reference-signal and another signal, such as the first-digital-signal. Alternatively, the noise signal may be based on a comparison between the first-digital-reference-signal and a second-digital-reference-signal supplied from a second reference node (not shown). Such a comparison may enable the identification of common signal components which may be identified as a noise signal that may advantageously be removed from the first-digital-signal. In further examples, the first-digital-reference-signal may itself be the noise signal.

While an undesirable noise signal may enter the first-active-data-pipe 230 by coupling from a ground or reference terminal, it will be appreciated that other potential sources of noise may exist and that in other examples the first-reference-node 280 may be coupled to any node within the first-active-data-pipe 230, such that an undesirable noise signal may be detected, characterised and then subtracted, by the baseband processor 220, in order to provide a noise-cancelled-first-digital-signal.

The processor 202 includes the necessary wiring and switches in the configurable-pipeline-multiplexer 242 to enable switching of the input of an otherwise idle ADC to an internal node to be measured. By measuring an internal node voltage and thereby determining the presence and characteristics of noise or spurs (spurious signals) the otherwise idle ADC may advantageously be used to enable the reduction of the unwanted noise or spurs and thereby enable the processor to provide a superior level of signal processing performance.

In some examples, multiple different internal nodes may be made available for selection by a suitably configured multiplexer. Depending on a circuit status or outcome of a measurement of a particular internal mode, the multiplexer may be configured to switch to another internal node to be measured. For example, the baseband processor 220 may have a predetermined sequence of nodes to measure. If a particular node in the sequence is found to be functioning correctly, then the baseband processor 220 may issue a control signal to the configurable-pipeline-multiplexer 242 to switch to measuring the next node. In this way, the performance of a series of different components in an active data pipe may be investigated to identify and characterise one or more examples of undesired performance, which may then be corrected by sending a suitable control signal to the relevant components to reconfigure their behaviour.

When required, the second-ADC 250 may be switched back into normal operation and used as an additional active data pipe for processing a received signal. For example, when a user of a device selects a particular functionality, such as a new radio channel to listen to, the baseband processor 220 may configure the configurable-data-pipe 240 to process the new radio channel signal and therefore cease to provide any noise and/or distortion reduction functionality. Thereby, the processor may still be configured to process, simultaneously, the maximum possible number of received signals based on the total number of data pipes present in the processor, while advantageously improving signal processing performance when one or more data pipes becomes available to monitor internal nodes, as described above.

It will be appreciated that, just as the configurable-data-pipe 240 comprises all of the same functionality as the first-active-data-pipe 230, so the first-active-data-pipe 230 may comprise all of the functionality of the configurable-data-pipe 240. Any data-pipe in a multiple pipeline receiver, according to the present disclosure, may be used as either an active data-pipe, as described above in relation to the first-active-data-pipe 230, or as a configurable data pipe, as described above in relation to the configurable-data-pipe 240. Thereby, a multiple pipeline receiver of the present disclosure may advantageously possess complete flexibility as to the use made of any particular data pipe at any particular time.

Figure 3:
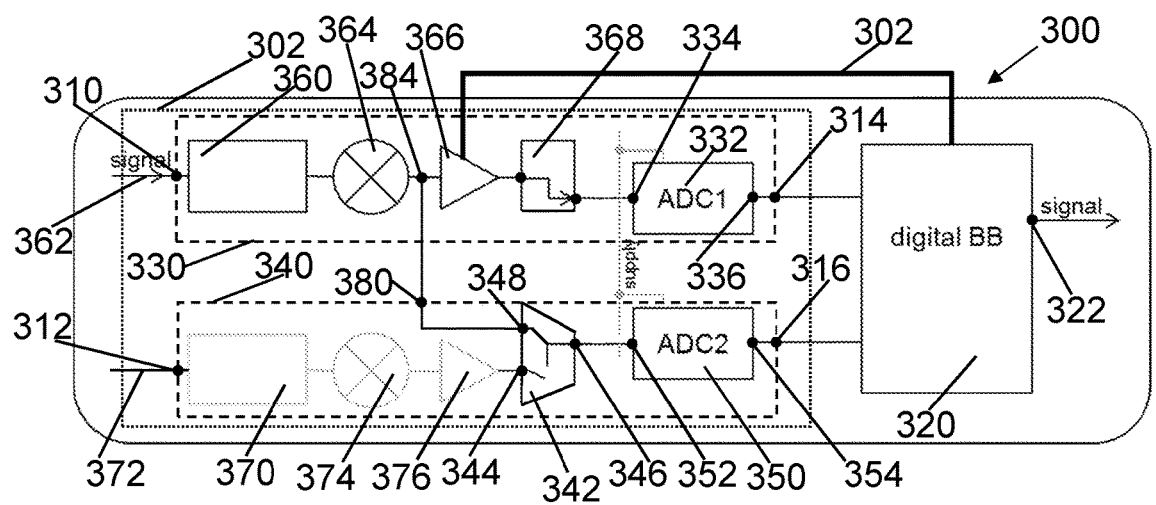
FIG. 3 shows an example embodiment of a multi-pipeline processor with a feedback loop implemented to provide for improved performance of the processor.

FIG. 3 shows an example of a multiple pipeline receiver 300; features shown in FIG. 3 that have corresponding features in FIGS. 1 and 2 have been given similar reference numerals, and may not necessarily be discussed further here.

The multiple pipeline receiver 300 comprises a first-reference-node 380. In this example, the first-reference node 380 is coupled to a first-active-pipeline-preamplifier-node 384, which is the input to a first-pipeline-amplifier 366. This coupling enables the configurable-data-pipe 340 to analyse signalling in the first-active-data-pipe 330 before it reaches the first-pipeline-amplifier 366.

The digital baseband processor 320 can compare the signals from the first-ADC 332 and the second-ADC 350, which are representative of signals after and before the operation of the first-pipeline-amplifier 366 respectively. The digital baseband processor 320 can process the results of this comparison to identify undesirable behaviour of the first-pipeline-amplifier 366. Such undesirable behaviour may include the generation of noise, but may also include the introduction of distortions to the desired signal. For example, if the comparison indicates that different frequency components have been amplified to a different extent, then the digital baseband processor 320 may determine that the first-pipeline-amplifier 366 is exhibiting non-linear behaviour. Such non-linear behaviour may arise, for example, from temperature based effects that occur when the first-pipeline-amplifier 366 operates at a temperature significantly different from the ambient temperature at which the first-pipeline-amplifier 366 is designed to function. This is one example of how the digital baseband processor 320 can compare one or more components of the first-reference-signal with other components of the first-reference-signal. Such a comparison can be used by the digital baseband processor 320 to determine whether or not any remedial action should be taken, such as reconfiguring the first-pipeline-amplifier 366 to modify its frequency response to make the response linear, or at least closer to being linear. In other examples, one or more components of the first-reference-signal may be compared with fixed threshold values in order to determine whether or not any remedial action should be taken.

Having detected such non-linear, or other unexpected and undesirable amplifier effect, the digital baseband processor 320 in this example can send a control signal 390 to the first-pipeline-amplifier 366. The digital baseband processor 320 can generate the control signal 390 based on the reference signal received from the second-ADC 350. The control signal 390 in this example can reconfigure the first-pipeline-amplifier 366, such as by setting one or more operational parameters of the first-pipeline-amplifier 366, in order to reduce or eliminate the undesirable effects.

It will be appreciated that the behaviour of other components within the first-active-data-pipe 330 may be measured by the configurable-data-pipe 340 by connecting the first-reference-node 380 to a suitable node within, or coupled to, an appropriate part of the first-active-data-pipe 330. In some examples, a plurality of configurable-data-pipes, and a plurality of associated reference-nodes can be used. For example, a reference node can be connected to nodes either side of a component in an active pipeline. Deviations away from expected or desired behaviour may be detected by comparing measured behaviour against a model of expected behaviour, in the form of an algorithm, spreadsheet, database or look-up table. Undesirable behaviour may be identified when measured behaviour deviates from expected behaviour by greater than a predetermined threshold amount. In this way undesirable performance by any component may be identified. Any component within the first-active-data-pipe 330 may then be reconfigured, on a periodic basis, or on an ongoing real-time basis, to improve the performance of the component.

The signal supplied by the second-analogue-to-digital-converter 350 to the digital baseband processor 320 may be representative of a noise signal present either within or upstream of the first-active-data-pipe 330. The first-analogue-to-digital-converter 332 may supply a signal to the digital baseband processor 320 that contains both a desired signal and the noise signal. The digital baseband processor 320 may then be configured to subtract the noise signal, received from the configurable-data-pipe, from the signal received from the first-active-data-pipe. This subtraction operation may provide a desired signal to the digital baseband processor output terminal 322 that contains a reduced, or essentially zero, noise signal. By reducing the noise signal in this way, the multiple pipeline receiver 300 may provide for advantageously improved performance.

It will be appreciated that the first-reference-node 380 may be coupled to a reference voltage, or ground, terminal coupled to the first-active-data-pipe 330. Such a coupling may also enable the digital baseband processor 320 to filter out noise associated with the first-active-data-pipe 330 from the signal provided to the digital baseband processor output terminal 322.

Depending on the configuration of the configurable-pipeline-multiplexer 342 in the configurable-data-pipe 340, two different use scenarios are possible for the multi-pipeline receiver 300:

1. Multiple reception pipes may be active (which is similar to the case illustrated in FIG. 1),
2. An idle ADC is available in the configurable-data-pipe: this ADC may therefore be used to measure an internal node voltage of the first-active-data-pipe, as described above.

FIGS. 1 to 3 all show examples of a multi-pipe receiver with just two pipelines illustrated. It will be appreciated that any number of pipelines above two may be present in a particular example. When any pipeline in a multi-pipe receiver is idle, it may be considered to be an available pipe. Such an available pipe may be used to measure any available internal (on chip) node voltage of any node in any active pipeline within the multi-pipe receiver. There are a number of advantages of using an available pipeline as disclosed herein compared to using, for example, a DC-bus Built In Self-Test (BIST) to calibrate the system. Such advantages including that measurement bandwidth using an available pipeline is that of the available ADC. This can provide for higher accuracy, particularly as the signal may be measured and digitized directly on-chip. This approach may compare favourably to bringing an analogue signal to the outside of the multi-pipe receiver, over the DC-bus, to a package pin. Using examples disclosed herein, measured data may be available in the digital domain for immediate processing, such as by a digital baseband processor. The digital baseband processor can then take appropriate action based on the available information. This can enable fast feedback to be implemented to reduce noise or distortion of a signal or to otherwise improve the operation of the multi-pipe receiver.

Modern highly integrated Radio Frequency Integrated Circuits (RFICs) combine more and more Intellectual Property (IP) blocks on the same single die. This may tend to increase the noise and spur levels. Appropriate countermeasures to control noise and spur level can be useful in ensuring that the chip meets its specifications. In the multi-pipe receiver, an available, idle, ADC can be used as a reference to compensate for supply noise and tones (spurs). A node that may advantageously be measured in this case may be the internal ground or the local supply voltage. The noise and spur levels can be lowered by using this signal information, for the same signal level, thereby resulting in improved Signal to Noise Ratio (SNR) and Spurious Free Dynamic Range (SFDR) which provide for improved performance. Especially in weak signal situations this noise and/or spur cancellation may result in a lower Bit Error Rate (BER) and thereby a better audio or video quality.

In addition to measuring the noise in a local IP ground or power supply, any node in the system may be measured (for example, bias-voltages, or a common-mode voltage in the circuit), as any node can be coupled to an input of an available ADC. Direct knowledge of internal on-chip critical nodes in the circuit may be used to improve the overall system performance or to add functionality, particularly by providing for feedback to enable the re-configuration of components to enable correction away from preferred operating performance criteria.

The software running in the digital base-band processor can create software loops, resulting in in-band spurious frequencies (spurs). In some examples, the commands or statements executed by the base-band processor may be performed in a predetermined sequence. These commands or statements may trigger electrical signals. A repetitive sequence of such electrical signals may result in an unwanted in-band frequency, which, depending on repetition rate, may cause degradation of the wanted signal. For example, if the repetition rate corresponds to an audible frequency, the software loop may result in audible artefacts being reproduced in an audio output of a multi-pipe receiver. To address this problem, the available ADC can be used to scan through the frequency band(s) to detect a spurious-frequency-signal by analysing the first-digital-reference-signal. For example, the digital base-band processor may compare one or more frequency sub-bands of the first-digital-reference-signal with a threshold value or a reference signal, and based on the result of the comparison determine that a spurious-frequency-signal exists. The digital base-band processor may also attribute an amplitude or spurious-frequency-value to the spurious-frequency-signal based on the result of the comparison.

The spurious-frequency-signal may correspond to a frequency of operation of the predetermined sequence. Thereby, a software loop that has induced a spur may be detected. The digital base-band processor can then be configured to take appropriate action to modify the predetermined sequence, such as to change the timing of commands executed by the software loop to avoid causing repetitive electrical signals with an undesirable frequency, and thereby reduce or eliminate the spurs caused by the software loop concerned. That is, the digital base-band processor can modify the predetermined sequence in order to reduce the spurious-frequency-value, or eliminate the spurious-frequency-signal.

Concurrently operating multiple pipelines, each with large bandwidth and high dynamic range, may provide a receiver chip that is highly vulnerable to interferences. Interferences can have many causes, for example interferences may be caused by a ripple on a power supply and/or a ground or reference terminal. Additionally, unwanted couplings may exist on a silicon die comprised by a processor of the present disclosure when formed as a single integrated circuit or chip. In other examples, electromagnetic ingress may occur whereby an electromagnetic field may couple into a part or parts of the processor and thereby cause noise or interference. Such noise or interference may be detected and reduced, or eliminated, by using one of the pipelines as a configurable-data-pipe as described in the present disclosure.

Another advantage of a processor according to the present disclosure is that it may be implemented with little impact on system design and/or the chip area required compared to existing multi-pipeline data processors. For example, it may not require an additional pin on an IC on which the processor is implemented.

Advantageously, signalling representative of a voltage at a reference node in a first-active-data-pipe may be processed by a configurable-data-pipe and then used by a digital baseband processor to configure a second-active-data-pipe. In some examples it may be known that the behaviour of one active data pipe may be similar to the behaviour of a second-active-data-pipe. In such cases, control signals may be sent to the second-active-data-pipe based on the behaviour of the first-active-data-pipe. This may avoid the need to process data derived from the second-active-data-pipe, without significantly prejudicing the performance improvements that may be provided to the second-active-data-pipe.

FIG. 4 shows a flowchart 400 that depicts a method of data processing. The method comprises, at step 402, receiving a first-receiver-signal in a first-active-data-pipe.

At step 404, the method comprises converting, with a first-analogue-to-digital-converter, the first-receiver-signal into a first-digital-signal.

At step 406, the method comprises providing the first-digital-signal to a first-output-node.

At step 408, the method comprises configuring a configurable-pipeline-multiplexer, in a configurable-data-pipe, to couple a first-reference-node, associated with the first-active-data-pipe, to a second-analogue-to-digital-converter in the configurable-data-pipe.

At step 410, the method comprises converting, with the second-analogue-to-digital-converter, a signal from the first-reference-node into a first-digital-reference-signal; and at step 412, providing the first-digital-reference-signal to a second-output-node.

In this way, the method may enable an otherwise idle second-analogue-to-digital-converter to characterise a noise signal, or other signal, present in the first-active-data-pipe such that the noise or other signal may be made available downstream to improve the processing of the first-digital-signal, as described above in relation to a multi-pipeline-processor.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A processor comprising:
a first-receiver-node for receiving a first-receiver-signal;
a second-receiver-node for receiving a second-receiver-signal;
a first-output-node for coupling to a digital-baseband-processor;
a second-output-node for coupling to the digital-baseband-processor;
a first-active-data-pipe extending between the first-receiver-node and the first-output-node, the first-active-data-pipe comprising:
a first-analogue-to-digital-converter comprising
a first-ADC-input coupled to the first-receiver-node; and
a first-ADC-output coupled to the first-output-node;
wherein the first-analogue-to-digital-converter is configured to provide a first-digital-signal to the first-output-node;
a first-reference-node associated with the first-active-data-pipe; and
a configurable-data-pipe extending between the second-receiver-node and the second-output-node, the configurable-data-pipe comprising:
a configurable-pipeline-multiplexer comprising:
a first-MUX-input-node coupled to the second-receiver-node;
a second-MUX-input-node coupled to the first-reference-node; and
a MUX-output-node; and
a second-analogue-to-digital-converter comprising:
a second-ADC-input coupled to the MUX-output-node; and
a second-ADC-output coupled to the second-output-node,
wherein, when the configurable-pipeline-multiplexer is configured to couple the second-MUX-input-node to the MUX-output-node, the second-analogue-to-digital-converter is configured to provide a first-digital-reference-signal to the second-output-node.

2. The processor of claim 1, wherein the first-reference node is coupled to one of a ground terminal, a reference terminal, a common-mode terminal or a bias voltage terminal.

3. The processor of claim 1, further comprising a digital baseband processor configured to determine a noise signal based on the first-digital-reference-signal and to subtract the noise signal from the first-digital-signal to provide a noise-cancelled-first-digital-signal to a baseband processor output terminal.

4. The processor of claim 3, wherein the noise signal is the first-digital-reference-signal.

5. The processor of claim 1, further comprising a digital baseband processor configured to:
receive the first-digital-reference-signal;
generate control signalling based on the first-digital-reference-signal; and provide the control signalling to the first-active-data-pipe to configure the first-active-data-pipe.

6. The processor of claim 5, wherein the digital baseband processor is configured to:
compare the first-digital-reference-signal with a predetermined threshold; and
generate the control signalling based on the result of the comparison.

7. The processor of claim 5, wherein the digital baseband processor is further configured to receive the first-digital-signal and to generate the control signalling based on the first-digital-signal.

8. The processor of claim 5, further comprising a digital baseband processor configured to receive signalling representative of a voltage at respective reference nodes and to provide control signalling to the first-active-data-pipe to configure the first-active-data-pipe based on the received signalling.

9. The processor of claim 5, wherein the first-active-data-pipe further comprises a first-tuner and the digital baseband processor is configured to provide the control signalling to the first-tuner in order to adapt the bandwidth of the first-tuner.

10. The processor of claim 5, wherein the first-active-data-pipe further comprises a first-pipeline-amplifier and the digital baseband processor is configured to provide the control signalling to the first-pipeline-amplifier in order to adapt a power supplied to the first-pipeline-amplifier.

11. The processor of claim 5, wherein the first-active-data-pipe further comprises a first-pipeline-amplifier and the digital baseband processor is configured to provide the control signalling to the first-pipeline-amplifier in order to adapt a frequency response to the first-pipeline-amplifier.

12. The processor of claim 5, wherein the digital baseband processor is configured to:
execute a series of commands according to a predetermined sequence;
detect a spurious-frequency-signal corresponding to a frequency of the predetermined sequence, based on the first-digital-reference-signal; and
modify the predetermined sequence.

13. The processor of claim 1, further comprising a plurality of reference nodes within the first-active-data-pipe, wherein the configurable-pipeline-multiplexer is configured to selectively couple each of the plurality of reference nodes to the MUX-output node.

14. The processor of claim 1, further comprising:
a second-active-data-pipe; and
a second-reference-node associated with the second-active-data-pipe,
wherein the configurable-pipeline-multiplexer comprises a third-MUX-input-node coupled to the second-reference-node.

15. An integrated circuit or an electronic device comprising the processor of claim 1.

* * * * *